(12) United States Patent
Ueyama (10) Patent No.: US 10,320,106 B2
(45) Date of Patent: Jun. 11, 2019

(54) ELECTRICAL COMPONENT SOCKET

(71) Applicant: ENPLAS CORPORATION, Kawaguchi-shi, Saitama (JP)

(72) Inventor: Yuki Ueyama, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 15/771,217

(22) PCT Filed: Oct. 24, 2016

(86) PCT No.: PCT/JP2016/081499
§ 371 (c)(1),
(2) Date: Apr. 27, 2018

(87) PCT Pub. No.: WO2017/073528
PCT Pub. Date: May 4, 2017

(65) Prior Publication Data
US 2018/0323526 A1    Nov. 8, 2018

(30) Foreign Application Priority Data

Oct. 27, 2015  (JP) .................................. 2015-210718

(51) Int. Cl.
*H01R 12/00* (2006.01)
*H01R 13/04* (2006.01)
(Continued)

(52) U.S. Cl.
CPC ............. *H01R 13/04* (2013.01); *G01R 31/26* (2013.01); *H01R 12/70* (2013.01); *H01R 13/24* (2013.01);
(Continued)

(58) Field of Classification Search
CPC .... H01R 23/722; H01R 23/725; H01R 9/097; H01R 13/6658; H01R 23/7073; H01R 12/585
(Continued)

(56) References Cited

U.S. PATENT DOCUMENTS 7,362,114 B2 * 4/2008 Winter ................. G01R 1/0441
                                                      324/756.02
9,017,081 B2    4/2015 Ueyama

FOREIGN PATENT DOCUMENTS

CN        103178384        6/2013
JP        11-45746         2/1999
(Continued)

OTHER PUBLICATIONS

International Search Report, PCT/ISA/210, dated Dec. 20, 2016, in corresponding International Patent Application No. PCT/JP2016/081499.
(Continued)

*Primary Examiner* — Phuong Chi T Nguyen
(74) *Attorney, Agent, or Firm* — Staas & Halsey LLP (57) ABSTRACT

For an electrical component socket including a socket base having a frame shape to which a contact module is to be inserted and attached from below, an embodiment has an objective to allow contact pins to be in contact with a circuit board with stability. The electrical component socket is configured such that the upper-side plate is caused to ascend to an uppermost position by elastic force of urging means in a state where the contact module is not attached to the socket base. In a state where the contact module is attached to the socket base and disposed on the circuit board, the upper-side plate moves down toward a lower-side plate side against elastic force of the contact pins to be positioned at a predetermined base position, so that lower-side contact (Continued)

portions of the contact pins are brought into contact with the circuit board at a predetermined contact pressure.

9 Claims, 6 Drawing Sheets

(51) Int. Cl.
  *H01R 33/76* (2006.01)
  *G01R 31/26* (2014.01)
  *H01R 12/70* (2011.01)
  *H01R 13/24* (2006.01)
  *H01R 12/71* (2011.01)

(52) U.S. Cl.
  CPC ......... *H01R 33/76* (2013.01); *H01R 12/7076* (2013.01); *H01R 12/714* (2013.01); *H01R 13/2435* (2013.01); *H01R 13/2471* (2013.01); *H01R 2201/20* (2013.01)

(58) Field of Classification Search
  USPC .................. 439/66, 74, 75, 76.1, 79, 82
  See application file for complete search history.

(56) References Cited

FOREIGN PATENT DOCUMENTS

| | | |
|---|---|---|
| JP | 2009-115463 | 5/2009 |
| JP | 2011-86453 | 4/2011 |
| JP | 2012-181948 | 9/2012 |

OTHER PUBLICATIONS

International Written Opinion, PCT/ISA/237, dated Dec. 20, 2016, in corresponding International Patent Application No. PCT/JP2016/081499.
Chinese Office Action dated Feb. 1, 2019 in corresponding Chinese PatentApplication No. 2016800629538.

* cited by examiner

ELECTRICAL COMPONENT SOCKET

CROSS-REFERENCE TO RELATED APPLICATION

This application is a U.S. National Stage Application which claims the benefit under 35 U.S.C. § 371 of PCT International Patent Application No. PCT/JP2016/081499, filed Oct. 24, 2016, which claims the foreign priority benefit under 35 U.S.C. § 119 of Japanese Patent Application No. 2015-210718, filed Oct. 27, 2015, the contents of which are incorporated herein by reference.

TECHNICAL FIELD

The present invention relates to an electrical component socket arranged on a circuit board and configured to receive an electrical component such as a semiconductor device (hereafter, referred to as an "IC package") for a burn-in test or the like of the electrical component.

BACKGROUND ART

As an "electrical component socket" of this type, there has been an IC socket configured to receive an IC package being an "electrical component" detachably.

As this IC socket, there is known an IC socket including a contact module that is configured to receive an electrical component and a socket base that has a frame shape and is configured to be disposed on a circuit board with this contact module inserted into and attached thereto from below. In this contact module, a plurality of contact pins are arranged in a vertical direction that are configured for electrically connecting terminals of an IC package and pads (electrodes) of the circuit board.

As these contact pins, there is proposed contact pins in each of which a barrel as an upper-side contact portion to come into contact with a terminal of an IC package and a plunger as a lower-side contact portion to come into contact with a pad of a circuit board are coupled to each other with an urging member such as coil spring or the like interposed therebetween, to retract and project freely in the vertical direction, and these barrel and plunger are both provided to move upward and downward freely relative to a socket body (e.g., see Patent Literature 1).

CITATION LIST

Patent Literature

Patent Literature 1: Japanese Patent Laid-Open No. 11-45746

SUMMARY OF INVENTION

Technical Problem

An IC socket having such a structure needs to be designed to allow a contact module to be housed in a space between a circuit board and a socket base. Therefore, the height of the contact module has to be set as designed or set to be slightly less than a designed value. However, when the height of the contact module is less than the designed value, contact between contact pins and the circuit board may become unstable.

The present invention thus has an objective to provide an electrical component socket that can connect contact pins to pads of a circuit board with stability, that is, achieve stabilization of preloading the contact pins.

Solution to Problem

To achieve such an objective, the present invention is an electrical component socket including: a contact module that includes a module body in which a plurality of contact pins are arranged to elastically expand and contract freely in a vertical direction, the contact module being configured to receive an electrical component; and a socket base that has a frame shape and is configured to be disposed on a circuit board with the contact module attached to the socket base, the electrical component socket causing the electrical component and the circuit board to be electrically connected to each other by means of the contact pins by upper-side contact portions and lower-side contact portions of the contact pins being contact with the electrical component and the circuit board, respectively, wherein the module body includes a lower-side plate and an upper-side plate that is disposed to move upward and downward freely relative to the lower-side plate while being urged upward by urging means, the socket base includes a height-fixing portion that is configured to regulate a position of the upper-side plate, in a state where the contact module is not attached to the socket base, the upper-side plate is caused to ascend to an uppermost position by urging force of the urging means, and in a state where the contact module is attached to the socket base and disposed on the circuit board, this contact module is sandwiched in the vertical direction by the height-fixing portion of the socket base and the circuit board, and the upper-side plate moves down toward a lower-side plate side against the urging force of the urging means to be positioned at a predetermined base position, so that the lower-side contact portions of the plurality of contact pins are brought into contact with the circuit board at a predetermined contact pressure.

In addition, the present invention is desirably configured such that, urging the upper-side plate upward, the plurality of contact pins also serve as the urging means.

Furthermore, in the present invention, it is desirable that in a state where the contact module is not attached to the socket base, the height of this contact module is set to be greater than a base height of a time when the upper-side plate is positioned at the base position.

Advantageous Effects of Invention

According to the present invention, in a state where the contact module is attached to the socket base and disposed on the circuit board, this contact module is sandwiched in the vertical direction by the height-fixing portions of the socket base and the circuit board, and the upper-side plate moves down toward a lower-side plate side against urging force of the urging means to be positioned at a predetermined base position. The lower-side contact portions of the plurality of contact pins are thereby brought into contact with the circuit board at a predetermined contact pressure, and thus it is possible to achieve stabilization of preloading the contact pins. As a result, it is possible to conduct a burn-in test or the like on the electrical component properly.

In addition, in the present invention, configuring the contact pins to serve also as the urging means dispenses with the need of providing other urging means in addition to the contact pins, which can simplify the configuration of the electrical component socket.

In addition, in the present invention, setting beforehand the height of the contact module to be greater than the base height of the time when the upper-side plate is positioned at the base position enables the upper-side plate to be positioned at the predetermined base position smoothly, which in turn enables the above-described stabilization of preloading the contact pins to be achieved easily.

BRIEF DESCRIPTION OF DRAWINGS

FIGS. 4A and 4B are schematic diagrams illustrating a use state of the IC socket according to the embodiment 1, where FIG. 4A is a diagram of a state where the contact module is not attached to the socket base, and FIG. 4B is a diagram of a state where the contact module is attached to the socket base and disposed on a circuit board.

FIGS. 5A and 5B are schematic diagrams illustrating a use state of an IC socket, where FIG. 5a is a diagram illustrating a case where the height of a contact module is as designed, and FIG. 5B is a diagram illustrating a case where the height of the contact module is lower than its design value.

DESCRIPTION OF EMBODIMENT

Hereafter, an embodiment of the present invention will be described.

FIG. 1 to FIG. 4B illustrate an embodiment 1 of the present invention.

Figures 4A, 4B:
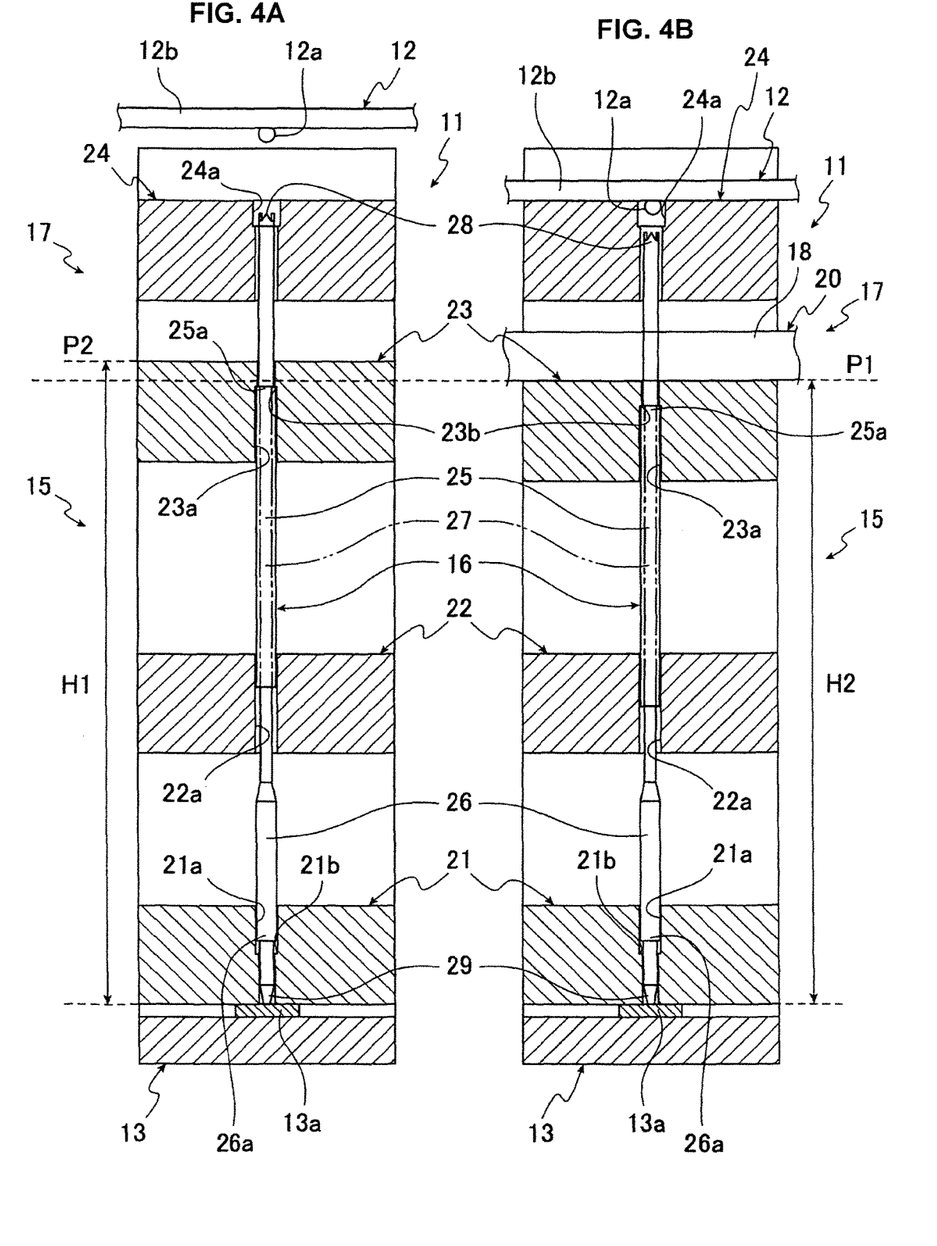

An IC socket 11 as an "electrical component socket" according to the present embodiment 1 is, as illustrated in FIGS. 4A and 4B, configured to be arranged on a circuit board 13, and for conducting a burn-in test of an IC package 12 or the like as an "electrical component", the IC socket 11 is intended to make an electrical connection between spherical terminals 12a of this IC package 12 and pads 13a of the circuit board 13.

This IC package 12 is called a ball grid array (BGA), including a package body 12b having a square shape in plan view, and on a lower surface of this package body 12b, a plurality of spherical terminals 12a are arranged in a grid pattern and formed protruding downward. Note that FIGS. 4A and 4B illustrates only one of the plurality of spherical terminals 12a.

Figure 1:
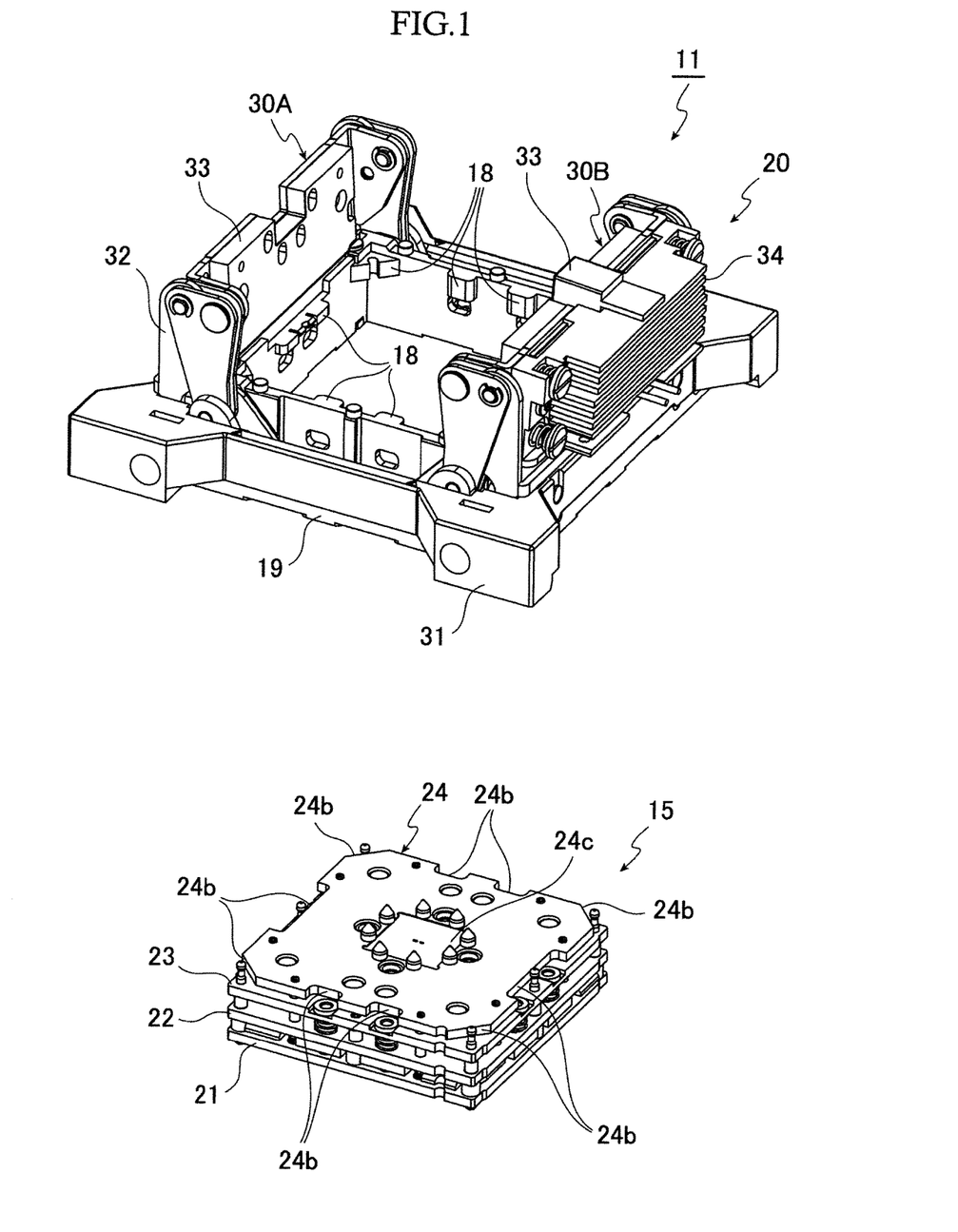
FIG. 1 is an exploded perspective view of an IC socket according to an embodiment 1 of the present invention.
Figure 2A:
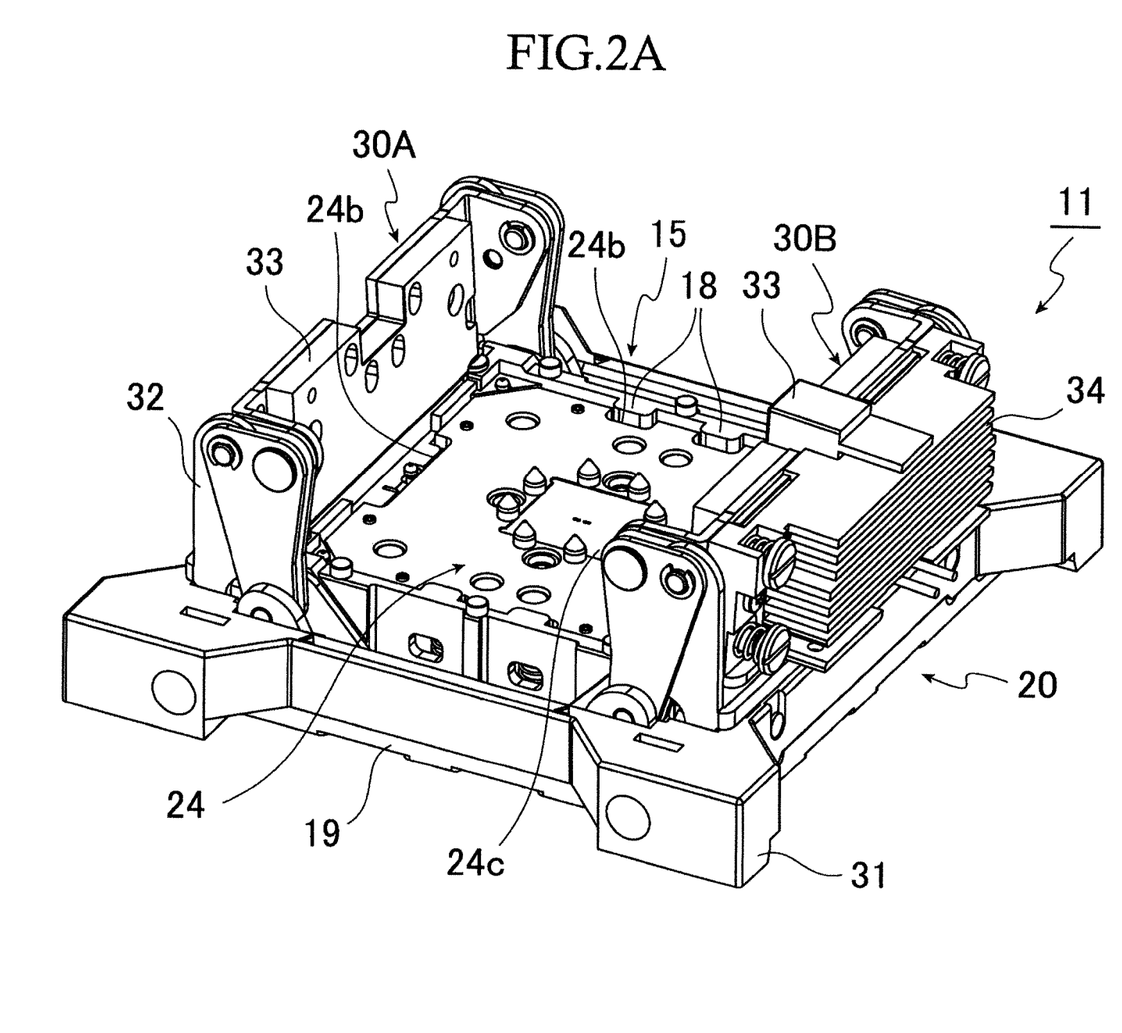
FIG. 2A is an assembly perspective view of the IC socket according to the embodiment 1, being a diagram illustrating a state where a pair of opening/closing bodies is opened.
Figure 2B:
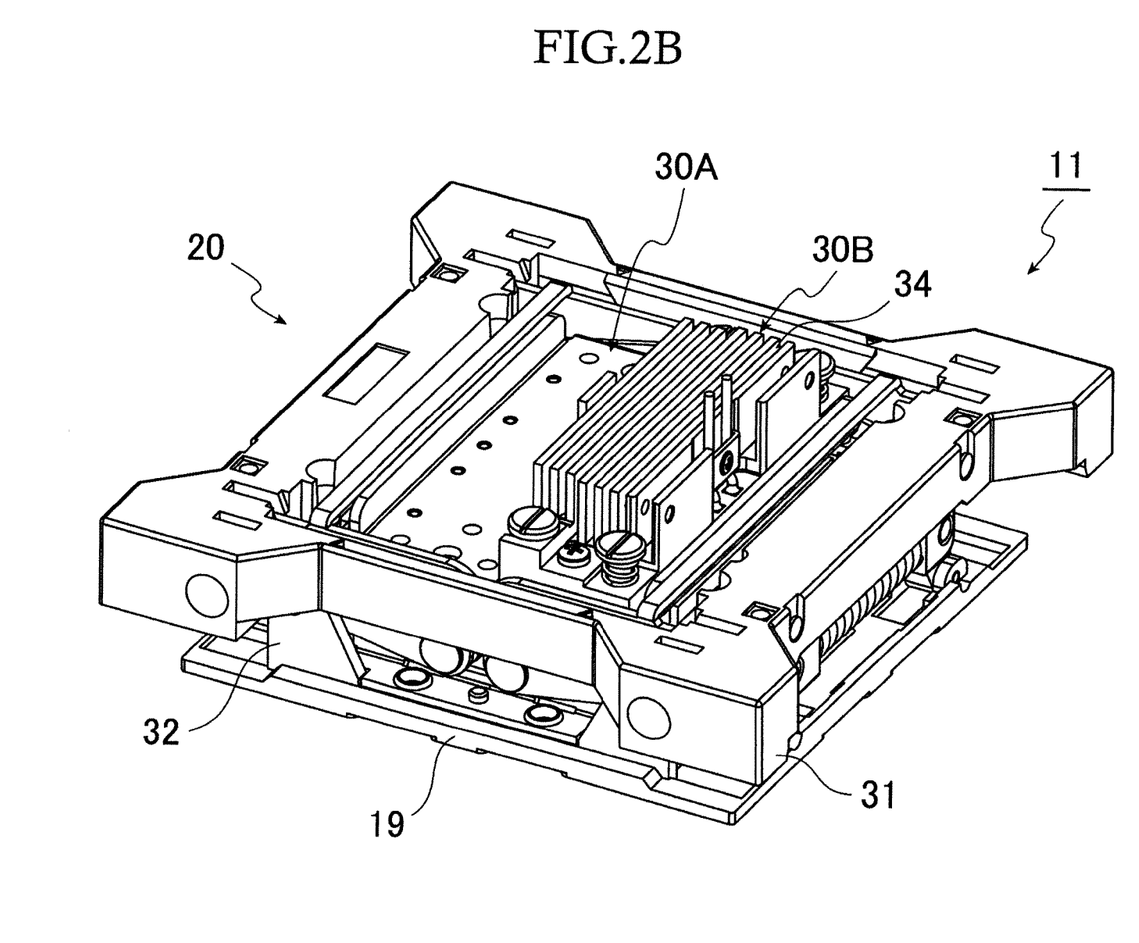
FIG. 2B is an assembly perspective view of the IC socket according to the embodiment 1, being a diagram illustrating a state where the pair of opening/closing bodies is closed.

In addition, the IC socket 11 includes, as illustrated in FIG. 1, FIG. 2A, and FIG. 2B, a contact module 15 that is configured to receive the IC package 12, and a socket base 20 that has a substantially rectangular-frame shape and is configured to be arranged on the circuit board 13 with this contact module 15 attached thereto from below.

This contact module 15 includes, as illustrated in FIGS. 4A and 4B, a module body 17 in which a plurality of contact pins 16 are arranged to elastically expand and contract freely in the vertical direction. Note that FIGS. 4A and 4B illustrates only one of the plurality of contact pins 16. The contact pins 16 each includes a barrel 25 that has a stepped cylindrical shape, a plunger 26 that has a stepped cylindrical shape and is attached to this barrel 25 to be inserted freely therethrough, and a coil spring 27 that is housed in the barrel 25 to urge these barrel 25 and plunger 26 in a direction of separating them (vertical direction). In an upper-end portion of the barrel 25, an upper-side contact portion 28 having a crown shape is integrally formed with the upper-end portion, and in a lower-end portion of the plunger 26, a lower-side contact portion 29 having a cone shape is integrally formed with the lower-end portion.

In addition, the module body 17 includes, as illustrated in FIG. 1 and FIGS. 4A and 4B, a lower-side plate 21, a center plate 22, an upper-side plate 23, and a floating plate 24. Here, the center plate 22 is fixed above the lower-side plate 21 with a predetermined gap. In addition, the upper-side plate 23 is arranged above the center plate 22 to move upward and downward freely. In addition, the floating plate 24 includes a package receiving portion 24c configured to receive the IC package 12 and is supported above the upper-side plate 23 to move upward and downward freely relative to the lower-side plate 21 while being urged upward by a coil spring not illustrated. In a peripheral portion of the floating plate 24, as illustrated in FIG. 1, a plurality of notch portions 24b are formed to correspond to a plurality of height-fixing portions 18 of a base body 19 to be described later.

In addition, in the lower-side plate 21, as illustrated in FIGS. 4A and 4B, a pin insertion hole 21a that is stepped and has a round shape is formed extending through in the vertical direction, and a stepped portion 21b of the lower-side plate 21 is configured to catch a stepped portion 26a of the plunger 26 of the contact pin 16, thereby regulating a descending motion of this plunger 26. In the center plate 22, a pin insertion hole 22a having a round shape is formed extending therethrough in the vertical direction, the pin insertion hole 22a allowing the barrel 25 of the contact pin 16 to be inserted in a freely, vertically movable manner. In the upper-side plate 23, a pin insertion hole 23a that is stepped and has a round shape is formed extending through in the vertical direction, and a stepped portion 23b of the upper-side plate 23 is configured to catch a stepped portion 25a of the barrel 25 of the contact pin 16, thereby regulating an ascending motion of this barrel 25. In the floating plate 24, a floating plate 24a that is stepped and has a round shape is formed extending therethrough in the vertical direction, the pin insertion hole 24a allowing the barrel 25 of the contact pin 16 to be inserted in a freely, vertically movable manner.

In addition, the contact pin 16 is configured, as illustrated in FIG. 4A, to serve also as urging means for urging the upper-side plate 23 upward with elastic force of the coil spring 27 in a state where the stepped portion 25a of the barrel 25 is caught by the stepped portion 23b of the upper-side plate 23.

Figure 3:
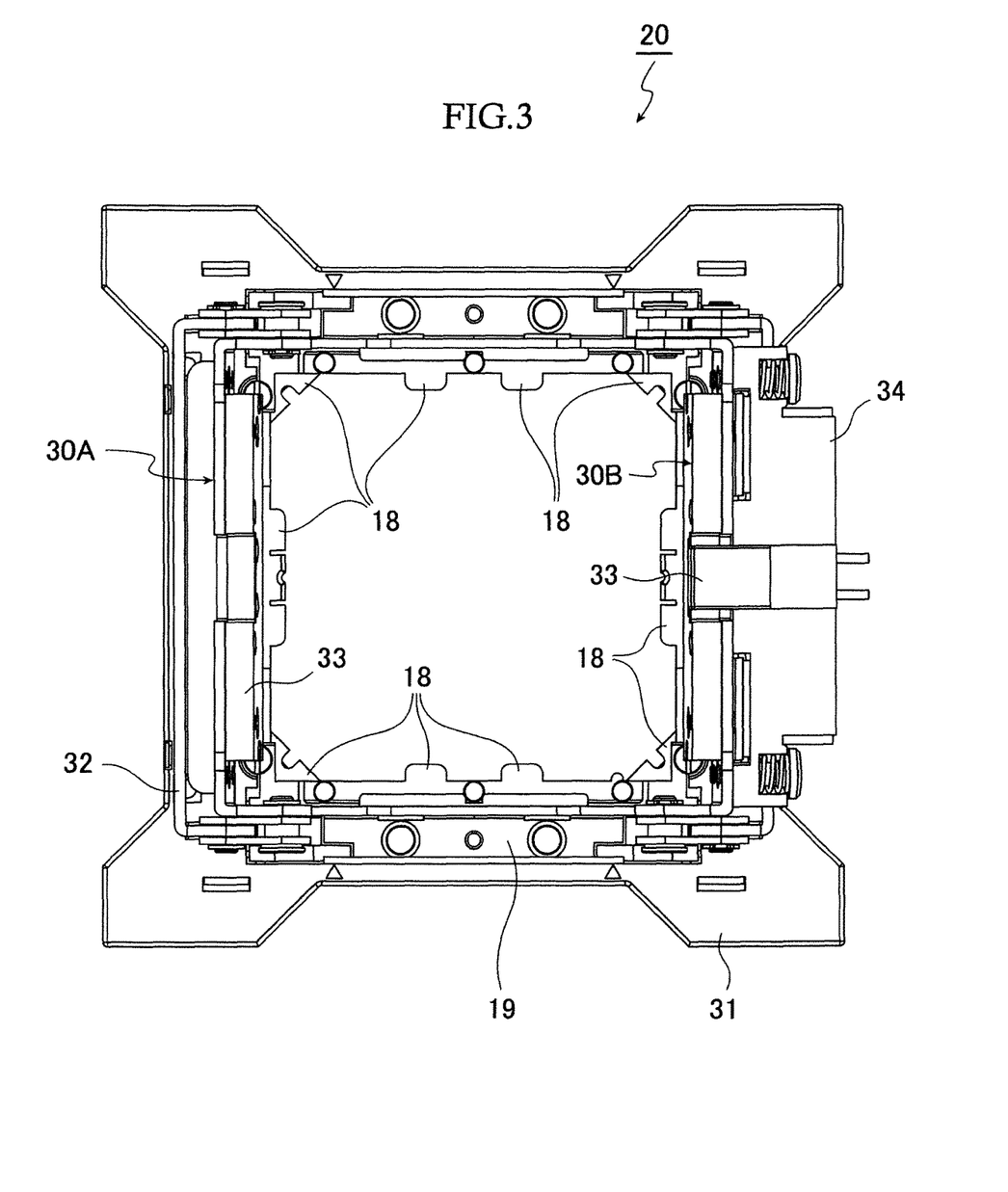
FIG. 3 is a plan view of a socket base of the IC socket according to the embodiment 1.

Meanwhile, the socket base 20 includes, as illustrated in FIG. 1 and FIG. 3, the base body 19 having a substantially rectangular-frame shape. On an inner circumferential surface of the base body 19, the plurality of (10 in the present embodiment 1) height-fixing portions 18 are formed protruding inward, and when the contact module 15 is inserted into and attached to the base body 19 from below, an upper surface of the upper-side plate 23 of the contact module 15 comes into contact with the height-fixing portions 18 to be positioned. In addition, to the base body 19, as illustrated in FIGS. 2A and 2B, a pair of opening/closing bodies 30 (30A and 30B) are attached to open and close freely, the opening/closing bodies 30 being configured to press the IC package 12, and a handling portion 31 having a rectangular-frame shape is attached to ascend and descend freely, the handling portion 31 being configured to open and close these opening/closing bodies 30 by means of a link mechanism 32. Of the pair of opening/closing bodies 30, one opening/closing body 30A (on the left side of FIG. 3) of the opening/closing bodies 30 includes a pressing member 33, and the other opening/closing body 30B (on the right side of FIG. 3) of the opening/closing bodies 30 includes a pressing member 33 and a heat sink 34. When the handling portion 31 is put in its lowermost position, the pair of opening/closing bodies 30 is in an open state as illustrated in FIG. 2A, and when the handling portion 31 is caused to ascend from this state to be positioned in its uppermost position, the pair of opening/closing bodies 30 is brought into a close state as illustrated in FIG. 2B.

Furthermore, in this IC socket 11, in a state where the contact module 15 is disposed on the circuit board 13 without being attached to the socket base 20, the upper-side plate 23 ascends to an uppermost position P2 by elastic force of the contact pin 16 as illustrated in FIG. 4A. In addition, in a state where the contact module 15 is attached to the socket base 20 and disposed on the circuit board 13, this contact module 15 is sandwiched in the vertical direction by the height-fixing portions 18 of the socket base 20 and the circuit board 13, and the upper-side plate 23 moves down toward a lower-side plate 21 side against elastic force of the contact pin 16 to be positioned at a predetermined base position P1 as illustrated in FIG. 4B, so that the lower-side contact portions 29 of the plurality of contact pins 16 are brought into contact with the circuit board 13 at a predetermined contact pressure.

As illustrated in FIGS. 4A and 4B, in the state where the contact module 15 is not attached to the socket base 20 (see FIG. 4A), a height H1 of this contact module 15 (a distance in the vertical direction from a lower surface of the lower-side plate 21 to the upper surface of the upper-side plate 23, of the contact module 15) is set to be greater than a base height H2 of a time when the upper-side plate 23 is positioned at the base position P1 (see FIG. 4B) (H1>H2).

Figure 5A:
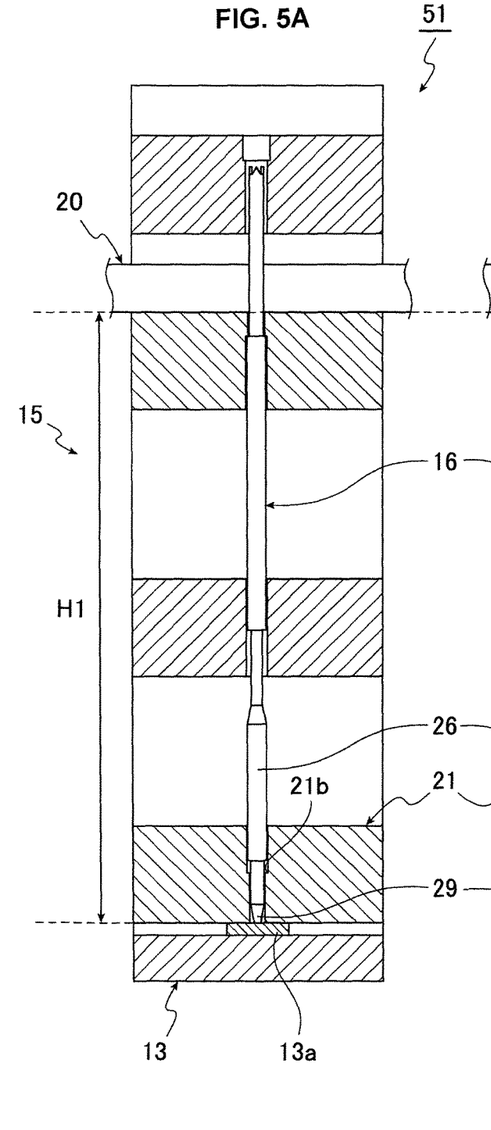
Figure 5B:
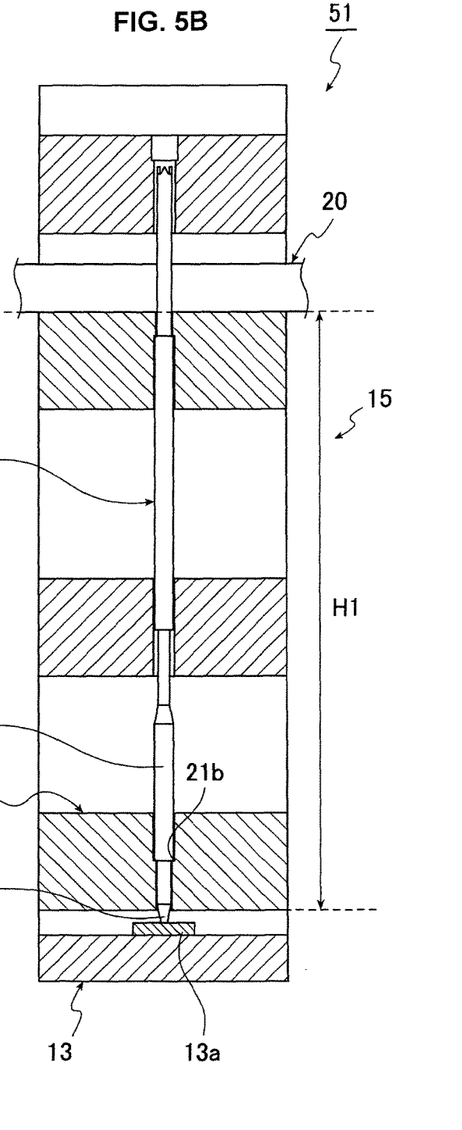

FIGS. 5A and 5B are schematic diagrams illustrating a use state of an IC socket according to a comparative example, where FIG. 5A is a diagram illustrating a case where the height of a contact module is as designed, and FIG. 5B is a diagram illustrating a case where the height of the contact module is lower than its design value.

As illustrated in FIGS. 5A and 5B, an IC socket 51 according to this comparative example includes no height-fixing portions 18.

As illustrated in FIG. 5A, if a height H1 of a contact module 15 is as designed, a plunger 26 of the contact pin 16 is not caught by a stepped portion 21b of a lower-side plate 21 of the contact module 15 when the contact module 15 is attached to the socket base 20 and disposed on the circuit board 13, so that a lower-side contact portion 29 of the contact pin 16 can be in contact with the pad 13a of the circuit board 13 at a predetermined contact pressure with stability.

However, as illustrated in FIG. 5B, if the height H1 of the contact module 15 is lower than its designed value, the plunger 26 of the contact pin 16 is caught by the stepped portion 21b of the lower-side plate 21 of the contact module 15, so that the contact pressure of the contact pin 16 against the pad 13a of the circuit board 13 may be lowered. As a result, contact between the lower-side contact portion 29 of the contact pin 16 and the pad 13a of the circuit board 13 becomes unstable, which can hinder a proper conduct of a burn-in test or the like on an IC package.

Next, how to use the IC socket 11 according to the present embodiment 1 will be described.

First, as illustrated in FIG. 1, from a state where the contact module 15 and the socket base 20 are separated, the contact module 15 is inserted into and attached to the socket base 20 from below, and the IC socket 11 is assembled as illustrated in FIG. 2A.

At this point, as described above, since the notch portions 24b corresponding to the height-fixing portions 18 of the base body 19 are formed in the floating plate 24 laying at an uppermost portion of the contact module 15, the height-fixing portions 18 of the base body 19 come into contact with the upper-side plate 23 lying below the floating plate 24 as illustrated in FIG. 4B.

Next, this IC socket 11 is disposed on the circuit board 13. Then, in the contact pins 16, the plungers 26 come into contact with the pads 13a of the circuit board 13 to be lifted.

Thereafter, the IC package 12 is conveyed and mounted on the IC socket 11 by an automated machine not illustrated, with the pair of opening/closing bodies 30 of the socket base 20 opened. Then, as illustrated in FIG. 4B, the IC package 12 is arranged at a predetermined position on the floating plate 24 of the IC socket 11, and the spherical terminals 12a fit into the pin insertion holes 24a of the floating plate 24.

Next, by causing the handling portion 31 of the socket base 20 to ascend to be positioned at its uppermost position, the pair of opening/closing bodies 30 is closed (see FIG. 2B). Then, the IC package 12 is pressed downward, and the floating plate 24 of the IC socket 11 is pressed down toward an upper-side plate 23 side. As a result, the spherical terminals 12a of the IC package 12 come into contact with and press down the barrels 25 of the contact pins 16, and thus, in the contact pins 16, the lower-side contact portions 29 are in contact with the pads 13a of the circuit board 13 at a predetermined contact pressure, and the upper-side contact portions 28 are in contact with the spherical terminals 12a of the IC package 12 at a predetermined contact pressure.

As described above, the contact module 15 is attached to the socket base 20 and disposed on the circuit board 13, and in this state, as illustrated in FIG. 4B, this contact module 15 is sandwiched in the vertical direction by the height-fixing portions 18 of the socket base 20 and the circuit board 13, and the upper-side plate 23 moves down toward the lower-side plate 21 side against the elastic force of the contact pins 16 to be positioned at a predetermined base position P1. Therefore, it is possible to prevent beforehand such a situation where the contact pressure of the plungers 26 against the pads 13a of the circuit board 13 is lowered by the plunger 26 of the contact pins 16 being caught by the stepped portions 21b of the lower-side plate 21, thereby bringing the lower-side contact portions 29 of the contact pins 16 into contact with the pads 13a of the circuit board 13 at the predetermined contact pressure. As a result, the stabilization of preloading the contact pins 16 can be achieved.

In this state, a burn-in test or the like is conducted by causing current to flow in the IC package 12. At this point, as described above, since the stabilization of preloading the contact pins 16 is achieved, it is possible to conduct the burn-in test or the like on the IC package 12 properly. In addition, heat generated by the IC package 12 dissipates from the heat sink 34 in contact with the IC package 12, and thus it is possible to prevent a malfunction due to the heat generation of the IC package 12.

In addition, for this IC socket 11, a configuration is employed that urges the upper-side plate 23 of the contact module 15 upward using elastic force of the coil springs 27 of the contact pins 16. This dispenses with the need of providing other urge means in addition to the contact pins 16, which can simplify the configuration of the IC socket 11.

In addition, as described above, in this IC socket 11, in a state where the contact module 15 is not attached to the socket base 20, the height H1 of this contact module 15 is set to be greater than the base height H2 of the time where the upper-side plate 23 is positioned at the base position P1, and thus it is possible to position the upper-side plate 23 to the predetermined base position P1 smoothly, which in turn enables the stabilization of preloading the contact pins 16 to be achieved easily.

Although in the above-described embodiment 1, the description is made about the IC socket 11 that urges the upper-side plate 23 of the contact module 15 upward using the elastic force of the coil springs 27 of the contact pins 16, it is noted that alternative or additional urging means other than contact pins 16 can be used as the urging means for this upper-side plate 23.

In addition, it is needless to say that the shape, the number, or the like of the height-fixing portions 18 of the socket base 20 is not limited to those described above.

In addition, in the above-described embodiment 1, the description is made about the module body 17 including the lower-side plate 21, the center plate 22, the upper-side plate 23, and the floating plate 24, but the present invention is applicable also to a module body without the center plate 22 and the floating plate 24.

In addition, in the above-described embodiment 1, the description is made about the contact pins 16 in each of which the plunger 26 is attached to the barrel 25 to inserted freely therethrough, but the type of the contact pins is not limited to this type. For example, the present invention is applicable also to a contact pin of a double-slider type in which both of a lower-side contact member and an upper-side contact member are held slidably on both upper and lower sides of a tubular body, a contact pin of a single-slider type in which one of the lower-side contact member and the upper-side contact member is held slidably and the other one is fixed, and furthermore, a contact pin in which the lower-side contact member and the upper-side contact member are coupled to each other with a spring portion bent in an arc shaped interposed therebetween.

Furthermore, in the above-described embodiment 1, the present invention is applied to the IC socket 11 as the "electrical component socket", but the application is not limited to this, and of course the present invention is applicable to other devices.

REFERENCE SIGNS LIST

11 IC socket (electrical component socket)
12 IC package (electrical component)
13 circuit board
15 contact module
16 contact pin
17 module body
18 height-fixing portion
20 socket base
21 lower-side plate
23 upper-side plate
28 upper-side contact portion
29 lower-side contact portion
H1 height of contact module
H2 base height
P1 base position
P2 uppermost position

The invention claimed is:

1. An electrical component socket comprising:
   a contact module that includes a module body in which contact pins are arranged to elastically expand and contract freely in a vertical direction, the contact module being configured to receive an electrical component; and
   a socket base that has a frame shape and is configured to be disposed on a circuit board with the contact module attached to the socket base,
   the electrical component socket causing the electrical component and the circuit board to be electrically connected to each other by upper-side contact portions and lower-side contact portions of the contact pins being in contact with the electrical component and the circuit board, respectively, wherein
      the module body includes a lower-side plate, and an upper-side plate disposed to move upward and downward freely relative to the lower-side plate,
      the socket base includes a height-fixing portion that is configured to regulate a position of the upper-side plate,
      in a first state where the contact module is not attached to the socket base, the upper-side plate is caused to ascend to an uppermost position by an urging force,
      in a second state where the contact module is attached to the socket base and disposed on the circuit board, the contact module is sandwiched in the vertical direction by the height-fixing portion of the socket base and the circuit board, and the upper-side plate moves down toward the lower-side plate side against the urging force to be positioned at a predetermined base position, so that the lower-side contact portions of the contact pins are brought into contact with the circuit board at a predetermined contact pressure, and
      the height-fixing portion regulates the position of the upper-side plate in the second state by a predetermined height amount lower than the position of the upper-side plate in the first state.

2. The electrical component socket according to claim 1, wherein in the first state where the contact module is not attached to the socket base, a height of the contact module is set to be greater than a base height of a time when the upper-side plate is positioned at the base position.

3. The electrical component socket according to claim 1, wherein the predetermined height amount is determined so as to include a difference amount which is a difference between a height of the contact module and a designed height value of the contact module.

4. The electrical component socket according to claim 1, wherein the contact pins urge the upper-side plate upward, and thereby operate to provide the urging force.

5. The electrical component socket according to claim 4, wherein in the first state where the contact module is not attached to the socket base, a height of the contact module is set to be greater than a base height of a time when the upper-side plate is positioned at the base position.

6. An electrical component socket comprising:
   a contact module that includes a module body in which contact pins are arranged to elastically expand and contract freely in a vertical direction, the contact module being configured to receive an electrical component; and
   a socket base that has a frame shape and is configured to be disposed on a circuit board with the contact module attached to the socket base, the electrical component socket causing the electrical component and the circuit board to be electrically connected to each other by upper-side contact portions and lower-side contact portions of the contact pins being in contact with the electrical component and the circuit board, respectively, wherein the module body includes a lower-side plate, and an upper-side plate disposed to move upward and downward freely relative to the lower-side plate, the socket base includes a height-fixing portion that is configured to regulate a position of the upper-side plate, in a first state where the contact module is not attached to the socket base, the upper-side plate is caused to ascend to an uppermost position by an urging force, in a second state where the contact module is attached to the socket base and disposed on the circuit board, the contact module is sandwiched in the vertical direction by the height-fixing portion of the socket base and the circuit board, and the upper-side plate moves down toward the lower-side plate side against the urging force to be positioned at a predetermined base position, so that the lower-side contact portions of the contact pins are brought into contact with the circuit board at a predetermined contact pressure, and the upper-side plate moves down toward the lower-side plate side lower in the second state than in the first state.

7. The electrical component socket according to claim 6, wherein in the first state where the contact module is not attached to the socket base, a height of the contact module is set to be greater than a base height of a time when the upper-side plate is positioned at the base position.

8. The electrical component socket according to claim 6, wherein the contact pins urge the upper-side plate upward, and thereby operate to provide the urging force.

9. The electrical component socket according to claim 8, wherein in the first state where the contact module is not attached to the socket base, a height of the contact module is set to be greater than a base height of a time when the upper-side plate is positioned at the base position.

* * * * *

UNITED STATES PATENT AND TRADEMARK OFFICE
CERTIFICATE OF CORRECTION

PATENT NO. : 10,320,106 B2
APPLICATION NO. : 15/771217
DATED : June 11, 2019
INVENTOR(S) : Yuki Ueyama It is certified that error appears in the above-identified patent and that said Letters Patent is hereby corrected as shown below:

On the Title Page

Item (2), Filing Date, Delete "Apr. 27" and insert -- Apr. 26 --, therefor.

Signed and Sealed this
Tenth Day of September, 2019

Andrei Iancu
*Director of the United States Patent and Trademark Office*